United States Patent [19]
Fujisawa

[11] Patent Number: 5,998,302
[45] Date of Patent: Dec. 7, 1999

[54] METHOD OF MANUFACTURING SEMICONDUCTOR DEVICE

[75] Inventor: Tomotaka Fujisawa, Tokyo, Japan

[73] Assignee: Sony Corporation, Japan

[21] Appl. No.: 09/015,513

[22] Filed: Jan. 29, 1998

[30] Foreign Application Priority Data

Jan. 31, 1997 [JP] Japan ..................................... 9-018317

[51] Int. Cl.$^6$ ..................... H01L 21/3065; H01L 21/311; H01L 21/328
[52] U.S. Cl. .......................... 438/706; 438/712; 438/723; 438/724
[58] Field of Search .................................... 438/712, 720, 438/721, 723, 756, 706

[56] References Cited

U.S. PATENT DOCUMENTS

| | | | |
|---|---|---|---|
| 3,577,285 | 5/1971 | Rutz | 438/712 |
| 5,021,121 | 6/1991 | Groechel et al. | 438/712 |
| 5,756,391 | 5/1998 | Tsuchiaki | 438/723 |

*Primary Examiner*—Benjamin Utech
*Assistant Examiner*—Lynette T. Umez-Eronini
*Attorney, Agent, or Firm*—Ronald P. Kananen; Rader, Fishman & Grauer

[57] ABSTRACT

In a semiconductor device manufacturing method for etching an insulating film on the surface of a silicon semiconductor to expose the surface of the silicon semiconductor, and then forming a thin film so as to cover at least the etched portion. Simultaneously with or after etching, an SiC film is formed on the surface of a semiconductor which is exposed by the etching, and a thin film is formed on the SiC film without removing the SiC film. Specifically, the etching is performed by using carbon-based etching gas, for example, to form the SiC film simultaneously with the etching.

17 Claims, 5 Drawing Sheets

OPENING BY MIS RIE
OPENING BY MIS RIE

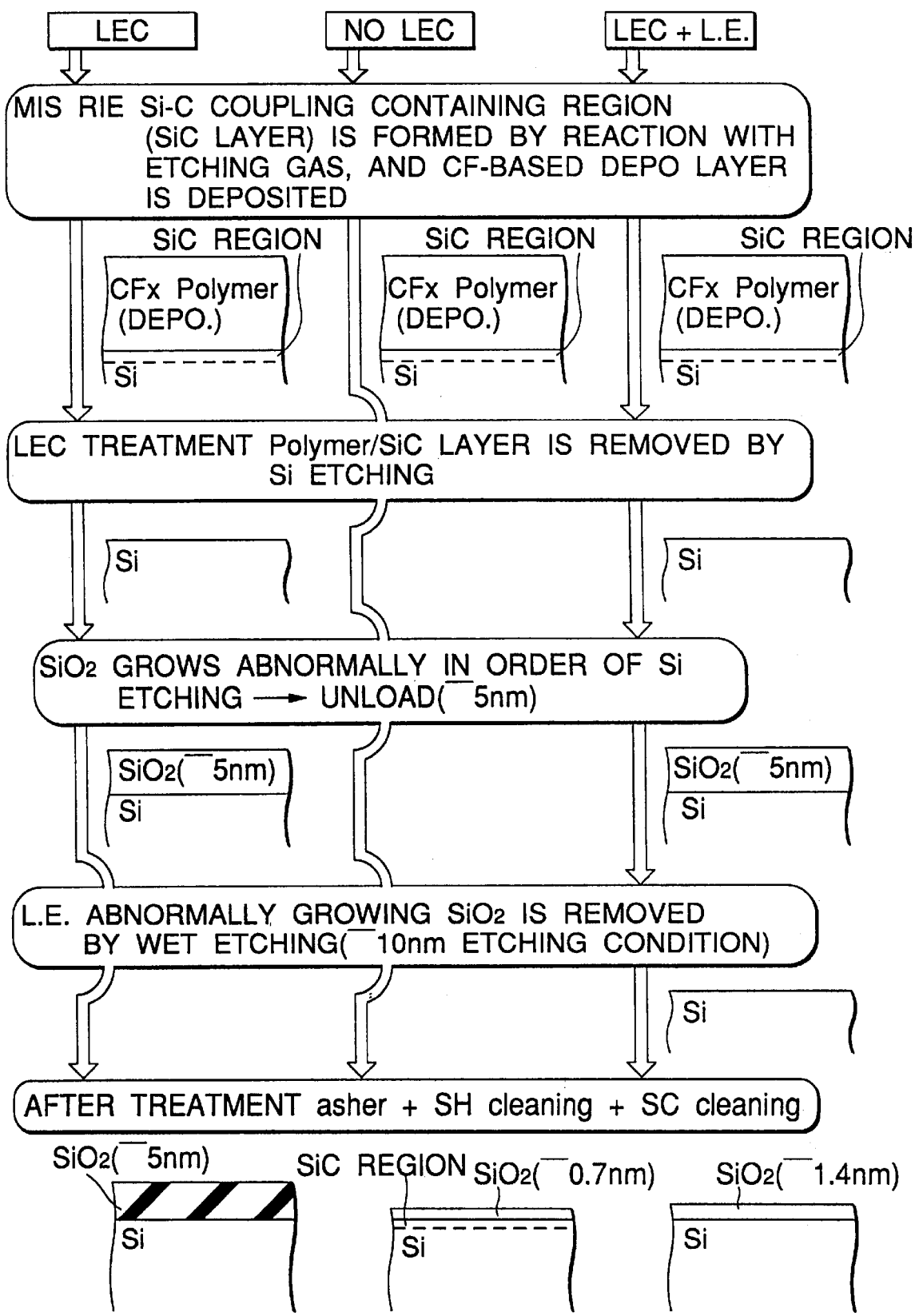

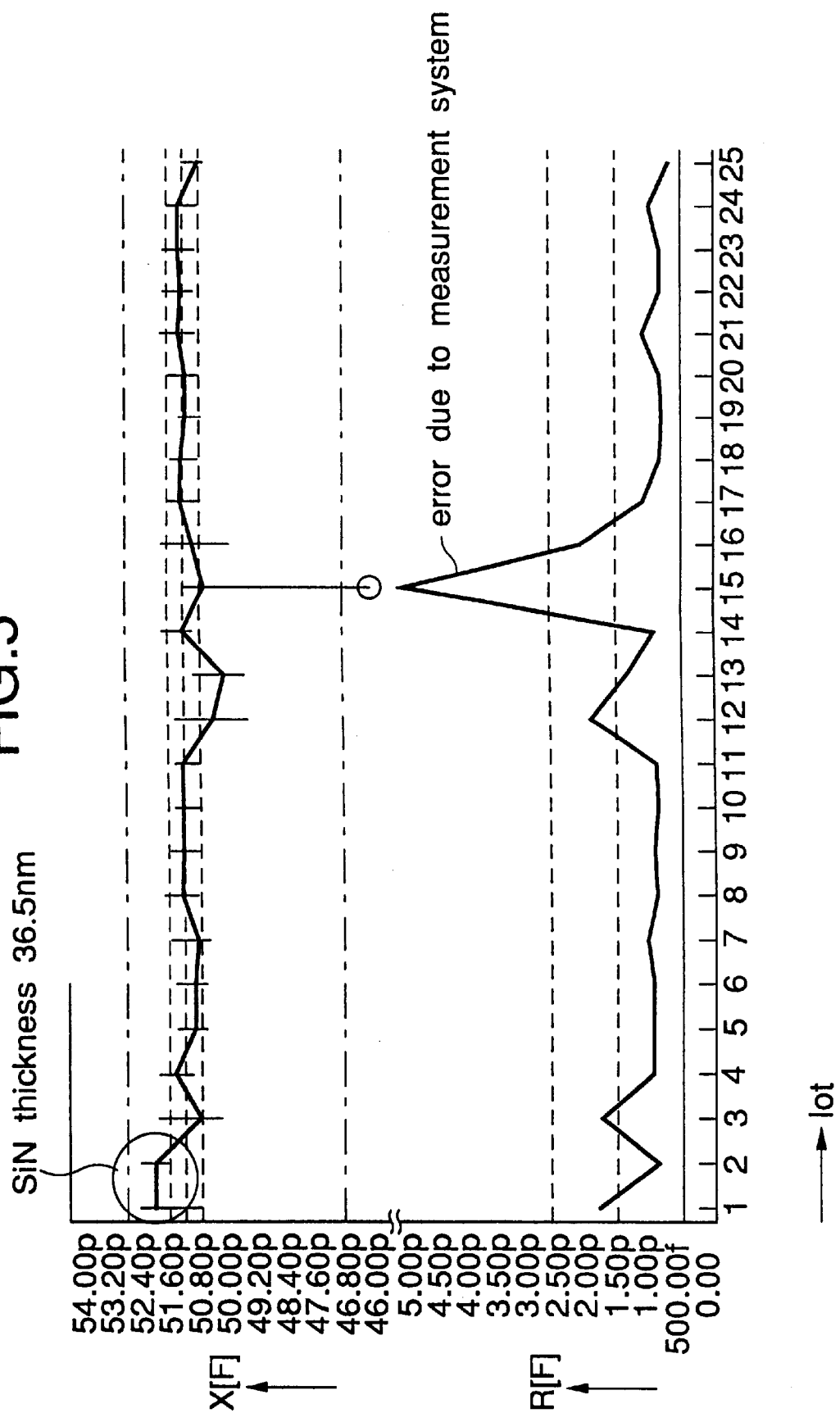

METHOD OF MANUFACTURING SEMICONDUCTOR DEVICE

BACKGROUND OF THE INVENTION

The present invention relates to a semiconductor device manufacturing method, and particularly to a semiconductor device manufacturing method of selectively or entirely etching an insulating film on the surface of a silicon semiconductor to entirely or selectively expose the surface of the silicon semiconductor, and then forming a thin film so as to cover at least the etched portion.

In order to establish the contact between a silicon semiconductor substrate or a patterned polysilicon semiconductor layer and other conductive layers in manufacturing of a silicon-based semiconductor device, there is passed a process of forming an interlayer insulating film before the other conductive layers are formed, then selectively etching a portion of the interlayer insulating film at which the contact is established (a photoresist film is selectively formed, and then a wet etching treatment is performed by using the film as a mask), thereby removing the portion and forming an opening, and then forming other conductive films (polysilicon film, silicide film, metal film) (the film is entirely formed by the Chemical Vapor Deposition (CVD), sputtering or the like, and then a photoetching treatment is performed).

When an MIS capacitor is formed, the insulating film on the surface of the semiconductor substrate in which each semiconductor region is formed is selectively etched to form an opening, and then an insulating film formed of silicon nitride $Si_3N_4$ which constitutes dielectric substance.

However, there is the problem that when the interlayer insulating film on the silicon semiconductor substrate or the patterned polysilicon semiconductor layer is etched to form an opening and expose the surface of the semiconductor substrate or the semiconductor layer, the surface of the opening portion is naturally oxidized from that time until the conductive layer or the insulating film constituting the dielectric substance is formed. The natural oxidation occurs due to cleaning in a solution treatment or when it is left in the air.

The natural oxidation increases the contact resistance, and causes dispersion, and thus this is inconvenient. In the case of a washed polysilicon emitter transistor, it causes dispersion in characteristics such as current amplification, frequency characteristic, etc. of the transistor, and this is inconvenient. In the case of MIS (Metal Insulator Semiconductor) capacitor, it reduces the capacitance value and causes the dispersion, and thus this is inconvenient.

In the case of the MIS capacitor, the parasitic capacitance due to a natural oxidation film serves as in-series capacitance to the original capacitance. The design of the insulating film formed of silicon nitride or the like which constitutes dielectric substance is directed to the thin film design due to shrinkage of IC which will be further severer in the future, and thus the degree of variation of the capacitance due to the natural oxidation film is increased more and more, so that this problem is extremely important.

Therefore, the inventor of this application has made various experiments, and consequently he has found out that a silicon carbide SixCy (hereinafter merely referred to as "SiC") film which is a composition of silicon and carbon (carbon) C has a function of prohibiting formation of the natural oxidation film. Therefore, he has groped to effectively use the SiC film in order to prohibit the natural oxidation film, and has implemented the present invention.

SUMMARY OF THE INVENTION

That is, the present invention has an object to prevent a natural oxidation film from being formed between the surface of semiconductor and a thin film in a semiconductor device manufacturing method of selectively of entirely etching an insulating film on the surface of silicon semiconductor to entirely or selectively expose the silicon semiconductor surface, and then forming a thin film which covers at least the etched portion.

A semiconductor device manufacturing device according to the present invention is characterized in that simultaneously with or after an etching treatment, an Sic film is formed on the semiconductor surface which is exposed by the etching treatment, and the thin film is formed on the SiC film without removing the SiC film.

According to the semiconductor device manufacturing method of the present invention, the SiC film is formed on the semiconductor surface which is exposed by the etching treatment, and the thin film is formed on the Sic film without removing the SiC film. Therefore, generation of a natural oxidation film before the thin film is formed can be prevented by the SiC film. Accordingly, disadvantages such as the increase of the contact resistance, the variation of the characteristics of the washed polysilicon emitter transistor, the reduction of the MIS capacitance, etc. due to the natural oxidation film can be avoided.

BRIEF DESCRIPTION OF THE DRAWINGS

FIGS. 2A to 2C represent the comparison results in formation of natural oxide film in three cases;

FIG. 5 is a diagram showing the average value/X every lot of the capacitance value of the MIS capacitor of each lot and the dispersion R in each lot in the embodiment shown in FIGS. 1A to 1E;

DETAILED DESCRIPTION OF THE PREFERRED EMBODIMENTS

The present invention will be described in detail on the basis of the preferred embodiments with reference to the accompanying drawings.

FIGS. 1A to 1E show an embodiment (first embodiment) in which the present invention is applied to formation of MIS capacitor.

Figure 1A:
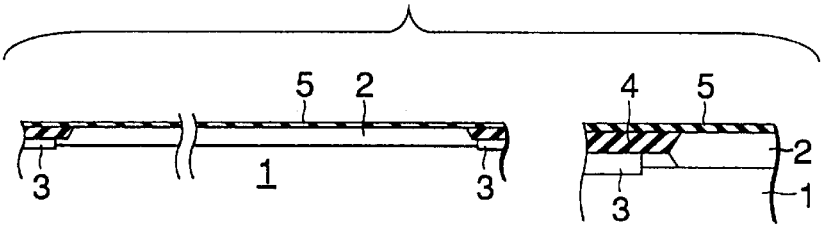
FIGS. 1A to 1E are cross-sectional views showing the process of a first embodiment of a semiconductor device manufacturing method according to the present invention.

(A) A selective oxidation film 4 is formed on a semiconductor substrate 1, ion-implantation and thermal diffusion treatments to form an isolation layer 3 are performed to perform element separation, and then a TEOS(Tetra Ethyl Ortho Silicate)—$SiO_2$ film 5 having a film thickness of about 130 nm is formed by pressure-reduced CVD. FIG. 1A shows a state after the TEOS—$SiO_2$ film 5 is formed. 2 represents a semiconductor region which serves as one electrode of an MIS capacitor, and it is element-separated from the other semiconductor regions by the selective oxidation film 4 and the isolation layer 3.

(B) Subsequently, the $SiO_2$ film 5 is selectively etched by RIE (Reactive Ion Etching) to form an opening 6. The region in which the opening 6 is formed will serve as an effective forming region of an MIS capacitance element. In the related art, the formation of the opening 6 is performed by the solution etching. However, in this embodiment, it is performed by RIE using carbon-based etching gas so that the growth of the natural oxidation film can be suppressed by forming an SiC film as described later to meet high precision and size-shrinkage design. The RIE condition at this time is set so that power of RF is equal to 750 W and the vacuum degree is equal to 227 Pa. As gas being used are set 60 SCCM for $CF_4$, 900 SCCM for Ar and 60 SCCM for $CHF_3$. By using the carbon-based etching gas containing carbon atoms as the etching gas as described above, a thin SiC film (not shown) is formed. The SiC film functions to suppress the generation of the natural oxidation film. This effect will be described in detail later.

Figure 1B:
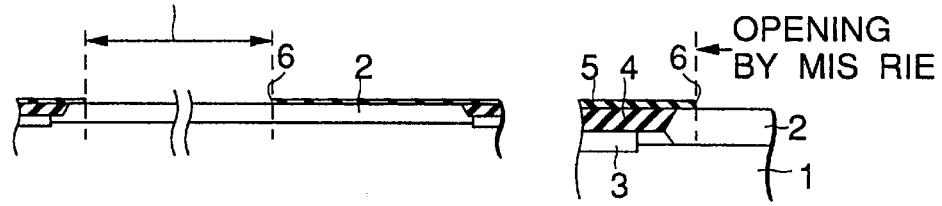

In order to expose the surface of the semiconductor region 2 of the semiconductor substrate 1 more perfectly, the etching is performed so as to overetch about 30% of the film thickness of the $SiO_2$ film 5. In this embodiment, the $SiO_2$ film is equal to about 130 nm, and thus the etching of about 170 nm is performed. FIG. 1B shows the state after the etching treatment. Although a very slight natural oxidation film is formed, the thickness thereof is about 0.7 nm and this is negligible level, and thus it is not shown. Further, the natural oxidation film is further thinner, and thus it is not shown.

Thereafter, a post-treatment is performed. Specifically, the resist film which is used as an etching mask in the selective etching treatment is removed by an ashing treatment using an asher. Thereafter, a cleaning treatment with sulfate hydrogen peroxide (SH: mixed solution of sulfuric acid and hydrogen peroxide) is performed and further a cleaning treatment with standard cleaning (SC: mixed water solution of ammonium and hydrogen peroxide) is performed, and the post-treatment of the selective etching is finished.

There has hitherto existed a technique for removing the insulating film on the semiconductor substrate by using the carbon-based etching gas. However, in such a case, in order to remove the natural oxidation film on the exposed surface of the semiconductor substrate and the damage layer, a light etching treatment for etching the surface, for example by about 10 nm, is performed after the etching is finished and before the resist film is removed (post-treatment). This etching is performed by using Light Etching Chamber, for example under the condition: power of RF of 100 W; vacuum degree of 133 Pa; 100 SCCM of $CF_4$ and 100 SCCM of $O_2$ in gas; and etching time of about 30 seconds. However, it has been found out by the inventor of this application that it is better to omit this etching treatment because the etching removes the SiC film which functions to suppress the formation of the natural oxidation film. This point will be described later with reference to FIGS. 2A to 2C.

Figure 1C:
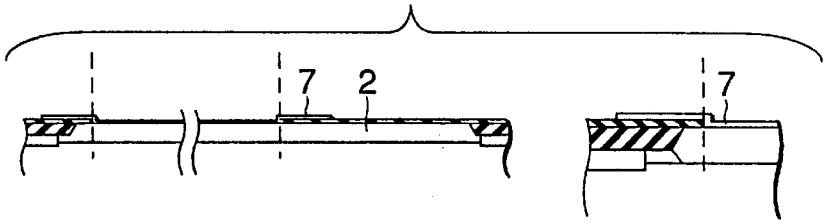

(C) Subsequently, an $Si_3N_4$ film (the film thickness is set to 20 to 40 nm) 7 which serves as dielectric substance of the MIS capacitor is formed by pressure-reduced CVD, and then the $Si_3N_4$ film 7 is patterned by the selective etching treatment. The selective etching is performed by a plasma etching using a photoresist film as a mask. FIG. 1C shows the state after the selective etching of $Si_3N_4$ film 7.

Figure 1D:
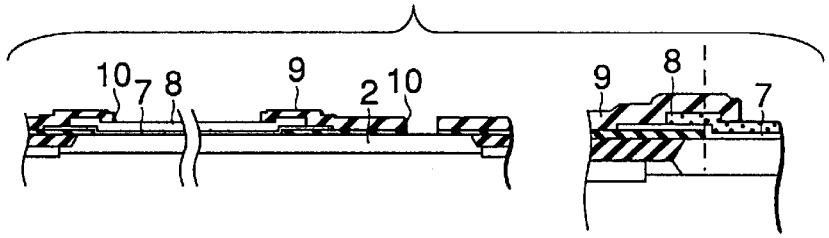

(D) Subsequently, a polysilicon layer (thickness is about 150 nm, for example) 8 which will serve as an upper electrode of the MIS capacitance is formed. Specifically, it is formed by forming a silicon layer through the pressure-reduced CVD, the doping of impurities and the etching using RIE with a photoresist film as a mask. Thereafter, an $SiO_2$ film (400 nm) 9 which will serve as an interlayer insulating film is formed by normal-pressure CVD, for example. Thereafter, the film 9 is selectively etched to be opened. 10 represents the opening. FIG. 1D shows the state after the opening 10 is formed.

Figure 1E:
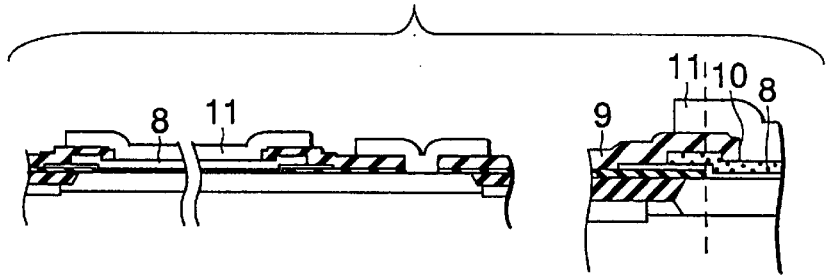

(E) Subsequently, an aluminum film 12 is formed by sputtering, for example, and then patterned. FIG. 1E shows the state after the patterning.

FIGS. 2A to 2C show generation of the natural oxidation film in three kinds of cases for comparison. FIG. 2A shows the case where MISRIE (the formation of the opening by RIE as shown in FIG. 1B), the light etching (LEC: the etching after MISRIE which has been hitherto carried out, but is not carried out in this embodiment) and the post-treatment (the treatment of removing the photoresist film, etc., and cleaning) are performed. In this case, an extremely thick natural oxidation film having a thickness of 5 nm is formed by unload after the light etching LEC.

FIG. 2B shows the case of this embodiment shown in FIGS. 1A to 1E, that is, the case where the post-treatment is performed without performing the light etching (LEC) after MISRIE. In this case, since the light etching is not carried out, the Sic film is not removed. Accordingly, the formation of the natural oxidation film can be suppressed by the SiC film, and the film thickness of the natural oxidation film in the final stage can be set to an extremely small value, 0.7 nm.

FIG. 2C shows the case where a wet etching treatment (etching depth is 10 nm) for removing the natural oxidation film is performed after the MISRIE, LEC treatments are performed, and then the post-treatment is performed. In this case, the natural oxidation film is equal to 1.4 nm.

As is apparent from FIGS. 2A to 2C, the case shown in FIG. 2B, that is, the case of this embodiment in which the LEC treatment step is not carried out produces the most desirable effect.

Figure 3:
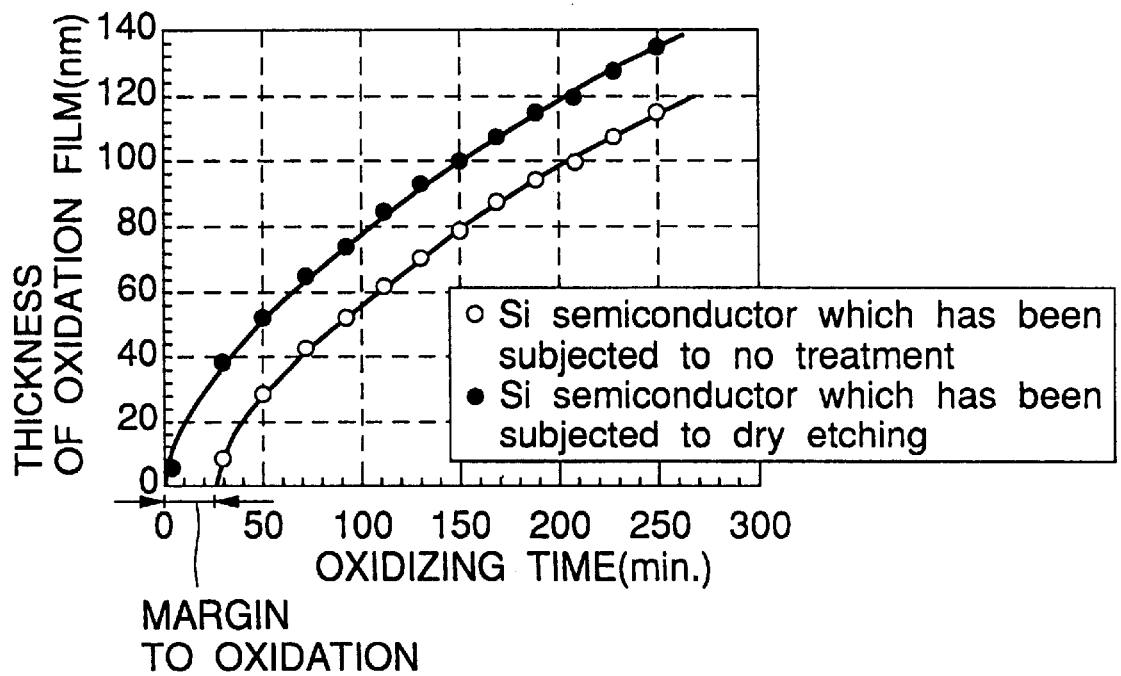
FIG. 3 is a graph showing the relationship between the oxidizing time and the film thickness of the oxide film formed by oxidation in the case of the silicon semiconductor substrate (as indicated by white dot) which is subjected to the driving etching treatment using the carbon-based etching gas, and in the case of the silicon semiconductor substrate (as indicated by black dot) which is subjected to no driving etching treatment.

FIG. 3 shows the relationship between the oxidizing time and the film thickness of the oxide film formed by the oxidation both in the case of a silicon semiconductor substrate (indicated by a white dot) which is subjected to a dry etching treatment by using carbon-based etching gas and in the case of a silicon semiconductor substrate (indicated by a black dot) which is not subjected to the dry etching treatment. As is apparent from FIG. 3, in the case of the silicon semiconductor substrate which is subjected to the dry etching using the carbon-based etching gas (as indicated by the white dot), there is a margin to oxidation, that is, a time (about 30 minutes) from the start time of the oxidation until the oxide film is formed. On the other case, in the case where the dry etching treatment is not performed, there is no margin to the oxidation. The margin makes a difference in thickness of the oxidation film to the same oxidation time. The difference is equal to about 20 nm. As described above, it is understandable that the dry etching treatment using the carbon-based etching gas is remarkably effective to thin the natural oxidation film.

Figure 4:
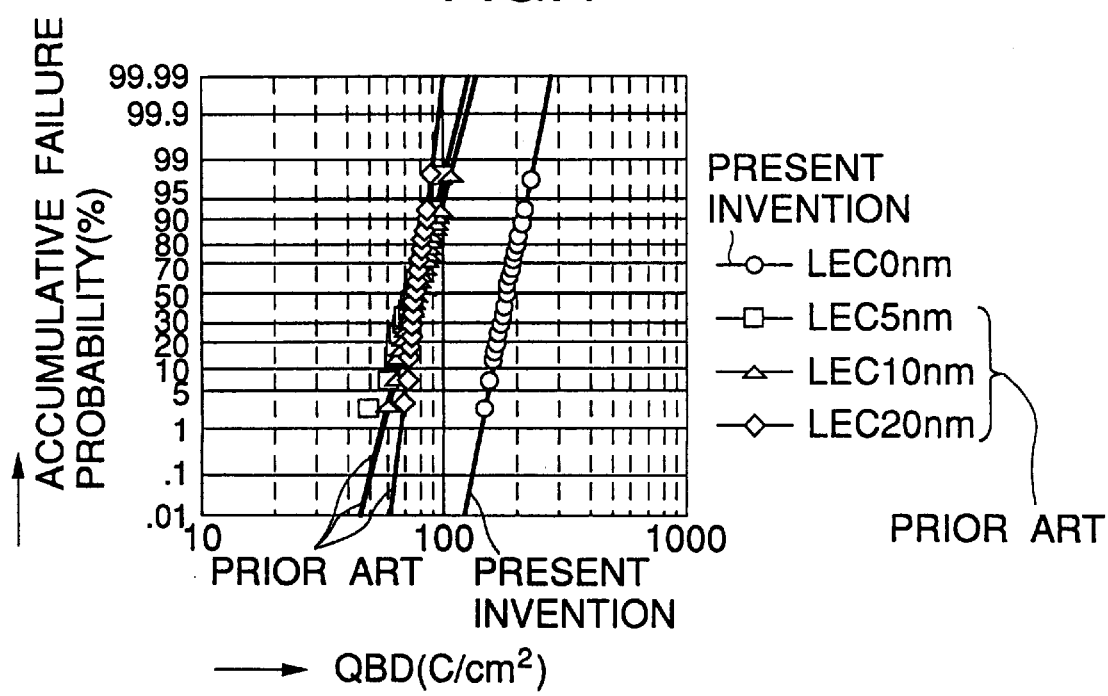
FIG. 4 is a graph showing the relationship between $Q_{BD}$ ($C/cm^2$) of MIS capacitor and accumulative fraction defective (%) in four cases on light etching.

FIG. 4 shows the relationship between $Q_{BD}$ (C/cm$^2$) of the MIS capacitor and the accumulative fraction defective (%) in four cases on the light etching. The goodness of film quality of the dielectric film (Si$_3$N$_4$) is higher as the curved line is more shifted to the right, and this shows that the dielectric breakdown of the dielectric film is harder to occur, that is, the film quality of the dielectric film is higher when no light etching is carried out (LEC 0 nm). That is, when charges are filled into the MIS capacitor, the terminal voltage is increased in proportion to the charged amount, and the MIS capacitor is finally broken down. Therefore, capacitance elements of several tens or several hundreds are charged, and the charge amount which is increased until each element is broken down and finally breaks down the element is measured. A graph shown in FIG. 4 is obtained by plotting each charge amount (C/cm$^2$) on the abscissa while plotting the accumulative fraction defective (%) on the ordinate. It is understood from this graph not only that there is no possibility that the film quality is lowered, but also that the film quality is enhanced.

FIG. 5 is a diagram showing the average value/X (in the specification, / is used in place of bar for convenience's sake, however, /X represents an average value) every lot of the capacitance value of the MIS capacitance of each lot and the dispersion R in each lot (the difference between the average value of the lots and the capacitance value having the largest difference from the average value). As described above, the dispersion of the average capacitance/X of the lots is small, and the dispersion R in each lot is small. It has been found the lot of lot number 15 has extremely larger R as compared with the other lots is caused by an error in a measurement system.

As is apparent from FIG. 5, the dispersion between the lots and the dispersion in each lot are regarded as being very small.

Figure 6A:
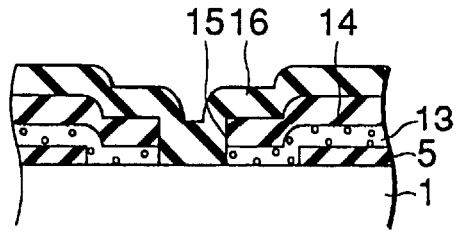
FIGS. 6A to 6C are cross-sectional views showing the process of a second embodiment of a semiconductor device manufacturing method according to the present invention.
Figure 6B:
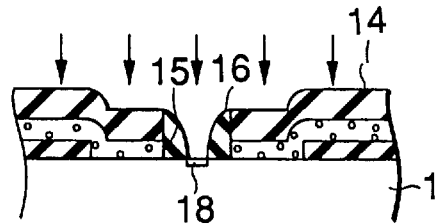
Figure 6C:
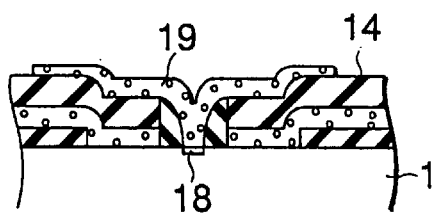

FIGS. 6A to 6C show the process of an embodiment (second embodiment) in which the present invention is applied to manufacture a washed polysilicon emitter type double polysilicon type bipolar transistor.

(A) An interlayer insulating film 14 is formed on a polysilicon layer 13 which is a first layer, and a selective etching treatment is performed to form an emitter forming opening 15 in the interlayer insulating film 14 and the polysilicon layer 13. Thereafter, a side-wall forming insulating film 16 is formed. FIG. 6A shows the state after the insulating film 16 is formed.

(B) Thereafter, an etching treatment using RIE is performed on the side-wall forming insulating film 16 to leave the insulating film 16 only on the inner surface of the opening 15. This etching treatment is performed by using carbon-based etching gas in the same manner as the embodiment shown in FIG. 1, whereby an SiC film 18 is formed on the surface of the substrate 1.

(C) Thereafter, a polysilicon layer 19 which is a second layer is formed, whereby an emitter is formed.

Since the formation of the natural oxide film can be also suppressed by the SiC film in this embodiment, the dispersion in characteristics of transistors due to the dispersion in the film thickness and film quality of the natural oxide film can be reduced.

Figure 7A:
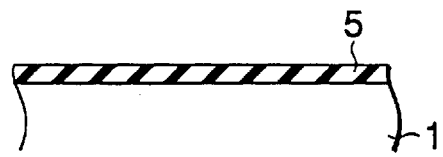
FIGS. 7A to 7C are cross cross-sectional views showing the process of a third embodiment of a semiconductor device manufacturing method according to the present invention.
Figure 7B:
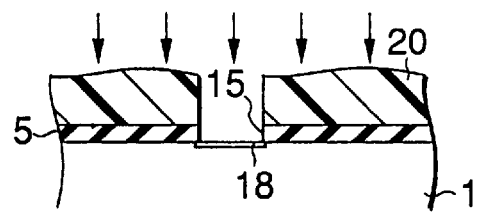
Figure 7C:
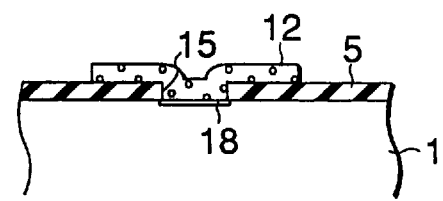

FIGS. 7A to 7C show the process of an embodiment (third embodiment) in which the present invention is applied to manufacture a washed polysilicon emitter type single polysilicon type bipolar transistor.

(A) As shown in FIG. 7A, an insulating film 5 is formed on a substrate 1.

(B) Subsequently, as shown in FIG. 7B, the insulating film 5 is subjected to the RIE etching treatment using carbon-based etching gas in the same manner of the embodiment shown in FIG. 1 by using the resist film 20 as a mask to form an emitter forming opening 15, whereby an SiC film 18 occurs on the surface of the substrate 1.

(C) Thereafter, the resist film 20 which is used as the etching mask is removed, then a polysilicon layer 21 serving as an emitter is formed, and then the polysilicon layer 21 is patterned.

Since the formation of the natural oxide film can be also suppressed by the SiC film in this embodiment, the dispersion of the characteristics of the transistors due to the dispersion of the film thickness and the film quality of the natural oxide film can be reduced.

According to each of the above-described embodiments, the SiC film for suppressing the formation of the natural oxide film is formed by the RIE etching treatment using the carbon-based etching gas. However, the SiC film may be formed by ion-implanting carbon onto the surface portion of the semiconductor substrate. Further, each of the above-described embodiments is applied to the case where the insulating film on the surface of the semiconductor substrate is selectively formed to partially expose the surface thereof. However, it is applicable to the case where the insulating film is entirely etched. Further, the semiconductor on which the insulating film is formed is a monocrystal semiconductor substrate (strictly, there is a case where it is an epitaxial growth layer). However, it may be a polysilicon semiconductor layer or an amorphous semiconductor layer, particularly a patterned polysilicon semiconductor layer or amorphous semiconductor layer.

According to the semiconductor device manufacturing method of the present invention, the SiC film is formed on the surface of the semiconductor which is exposed by the etching, and the thin film is formed on the SiC film without removing the SiC film. Therefore, the formation of the natural oxide film before the thin film is formed can be suppressed by the SiC film. Accordingly, troubles such as the increase of the contact resistance, the variation of the characteristics of the washed polysilicon emitter transistor, the reduction of the MIS capacitance, etc. due to the natural oxide film can be overcome.

What is claimed is:

1. A method of manufacturing a bipolar transistor on a silicon semiconductor substrate, said method comprising the steps of:

selectively or entirely etching an insulating film on the surface of said silicon semiconductor substrate to entirely or selectively expose the surface of the silicon semiconductor substrate, forming a silicon carbide layer on the surface exposed by the etching simultaneously or after the etching, and depositing a thin conductive film directly on the silicon carbide layer without removing the silicon carbide.

2. The bipolar transistor manufacturing method as claimed in claim 1, wherein the silicon carbide layer is formed simultaneously with the etching treatment of entirely or selectively exposing the surface of the silicon semiconductor substrate by using carbon-based gas containing carbon atoms as etching gas.

3. The bipolar transistor manufacturing method as claimed in claim 2, wherein said carbon-based gas is formed by diluting mixture of CF$_4$ and CHF$_3$ with inert gas.

4. The bipolar transistor manufacturing method as claimed in claim 1, wherein the silicon carbide layer is formed by implanting carbon ions on to the exposed surface portion of the silicon semiconductor substrate after the etching treatment of entirely or selectively exposing the surface of the silicon semiconductor substrate.

5. The bipolar transistor manufacturing method as claimed in claim 1, wherein the silicon semiconductor substrate is monocrystal silicon semiconductor.

6. The bipolar transistor manufacturing method as claimed in claim 1, wherein the silicon semiconductor substrate is polycrystal or amorphous silicon conductor.

7. The bipolar transistor manufacturing method as claimed in claim 1, wherein said bipolar transistor is a polysilicon emitter type bipolar transistor.

8. The bipolar transistor manufacturing method as claimed in claim 7, wherein said thin conductive film deposited on the silicon carbide layer is a polysilicon film.

9. The bipolar transistor manufacturing method as claimed in claim 7, wherein said polysilicon emitter type bipolar transistor is a double polysilicon type bipolar transistor.

10. The bipolar transistor manufacturing method as claimed in claim 7, wherein said polysilicon emitter type bipolar transistor is a single polysilicon type bipolar transistor.

11. A method of manufacturing a semiconductor device comprising the steps of:

selectively or entirely etching an insulating film on the surface of said silicon semiconductor to entirely or selectively expose the surface of the silicon semiconductor, forming a silicon carbide layer on the surface exposed by the etching simultaneously or after the etching, and forming a thin insulating film directly on the silicon carbide layer without removing the silicon carbide.

12. The semiconductor device manufacturing method as claimed in claim 11, wherein the semiconductor device is a MIS capacitor.

13. The semiconductor device manufacturing method as claimed in claim 11, wherein the silicon carbide layer is formed simultaneously with the etching treatment of entirely or selectively exposing the surface of the silicon semiconductor by using carbon-based gas containing carbon atoms as etching gas.

14. The semiconductor device manufacturing method as claimed in claim 13, wherein said carbon-based gas is formed by diluting mixture of $CF_4$ and $CHF_3$ with inert gas.

15. The semiconductor device manufacturing method as claimed in claim 11, wherein the silicon carbide layer is formed by implanting carbon ions on to the exposed surface portion of the silicon semiconductor after the etching treatment of entirely or selectively exposing the surface of the silicon semiconductor.

16. The semiconductor device manufacturing method as claimed in claim 11, wherein the silicon semiconductor is monocrystal silicon semiconductor.

17. The semiconductor device manufacturing method as claimed in claim 11, wherein the silicon semiconductor is polycrystal or amorphous silicon conductor.

* * * * *